US006642747B1

(12) United States Patent
Chiu

(10) Patent No.: US 6,642,747 B1
(45) Date of Patent: Nov. 4, 2003

(54) FREQUENCY DETECTOR FOR A PHASE LOCKED LOOP SYSTEM

(75) Inventor: Hon Kin Chiu, Hayward, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/099,529

(22) Filed: Mar. 15, 2002

(51) Int. Cl.[7] ............................................. H03D 13/00
(52) U.S. Cl. ......................................... 327/40; 327/42
(58) Field of Search ............................... 327/2, 3, 7, 8, 327/9, 12, 40, 41, 42, 43, 47, 49, 147, 156, 157, 163; 331/25, DIG. 2; 375/215, 375, 376

(56) References Cited

U.S. PATENT DOCUMENTS

| 6,100,721 A | * | 8/2000 | Durec et al. ................ 327/3 |
| 6,133,797 A | * | 10/2000 | Lovelace et al. ............. 331/17 |
| 6,407,642 B2 | * | 6/2002 | Dosho et al. ................ 331/11 |
| 6,483,387 B1 | * | 11/2002 | Fernandez-Texon ......... 331/17 |

OTHER PUBLICATIONS

Messerschmitt, "Frequency Detectors for PLL Acquisition in Timing and Carrier Recovery," reprinted from *IEEE Trans. Comm.*, vol. COM–27, pp. 1288–1295, Sep. 1979, pp. 107–114.

\* cited by examiner

Primary Examiner—Timothy P. Callahan
Assistant Examiner—Linh Nguyen
(74) Attorney, Agent, or Firm—Bret A. Hertzberg; Merchant & Gould P.C.

(57) ABSTRACT

A frequency detector circuit is arranged to detect a frequency difference between a clock signal and a reference clock signal. The frequency detector circuit includes four flip-flop circuits and a clear logic circuit. The clear logic circuit is arranged to clear selected flip-flop circuits. Two of the flip-flop circuits are arranged to detect two consecutive transitions in the clock signal without a clearing signal to provide a DOWN signal. The other two flip-flop circuits are arranged to detect two consecutive transitions in the reference clock signal without a clearing signal to provide an UP signal. The average of the UP and DOWN signals over a time interval corresponds to the difference in frequency between the clock signal and the reference clock signal. The UP and DOWN signals provide signals that may be employed by a charge pump circuit in a phase-locked-loop system to adjust the frequency of a VCO.

14 Claims, 4 Drawing Sheets

FREQUENCY DETECTOR FOR A PHASE LOCKED LOOP SYSTEM

FIELD OF THE INVENTION

The present invention is related to phase locked loops. More particularly, the present invention is related to a frequency detector that may be used in a phase locked loop system to acquire a frequency lock.

BACKGROUND OF THE INVENTION

Phase-locked loop (PLL) circuits are useful in many electronic systems. Example application for PLL circuits include master clock generation for a microprocessor system, clock generation for a sampling clock in an analog-to-digital conversion system, clock generation for data recovery in a low-voltage differential signal (LVDS) driver/receiver system, as well as numerous other applications.

PLL applications typically provide an output clock signal by comparing the output clock signal to a reference clock signal. A phase-frequency detector (PFD) circuit is often employed to provide a raw control signal to a loop filter. The phase-frequency detector circuit provides the raw control signal in response to comparing the phase and frequency of the output clock signal to the reference clock signal. The loop filter often is a low-pass filter (LPF) that is arranged to provide a smoothed or averaged control signal in response to raw control signal. A voltage-controlled oscillator (VCO) is arranged to receive the control signal from the loop filter. The VCO produces the clock signal in response to the control signal such that the frequency of the clock is varied until the phase and frequency of the clock signal are matched to the reference clock signal.

One example PLL circuit includes a PFD circuit that provides UP and DOWN signals in response to the comparison between the output clock signal and the reference clock signal. The UP signal is active when the frequency of the output clock signal is low, while the DOWN signal is active when the frequency of the output clock signal is determined to be high. Similarly, the UP signal is active when the phase of the output clock is lagging behind the phase of the reference clock, and the DOWN signal is active when the phase of the output clock is leading the phase of the reference clock.

SUMMARY OF THE INVENTION

A frequency detector circuit is arranged to detect a frequency difference between a clock signal and a reference clock signal. The frequency detector circuit includes four flip-flop circuits and a clear logic circuit. The clear logic circuit is arranged to clear selected flip-flop circuits. Two of the flip-flop circuits are arranged to detect two consecutive transitions in the clock signal without a clearing signal to provide a DOWN signal. The other two flip-flop circuits are arranged to detect two consecutive transitions in the reference clock signal without a clearing signal to provide an UP signal. The average of the UP and DOWN signals over a time interval corresponds to the difference in frequency between the clock signal and the reference clock signal. The UP and DOWN signals provide signals that may be employed by a charge pump circuit in a phase-locked-loop system to adjust the frequency of a VCO.

According to one example, the frequency detector is useful in a frequency locked loop application. The frequency detector compares the frequency between a reference clock signal and another clock signal, without comparing the phase of the signals. The frequency detector provides UP and DOWN signal that indicate the difference in the reference clocks signal and the other clock signal. At steady-state, the UP and DOWN signals stabilize at a fixed logic level (i.e., a low logic level) when the frequency of the reference clock signal and the other clock signal are locked with respect to one another. The frequency locked relationship between the reference clock signal and the other clock signal is independent of any phase relationship between the signals.

According to another example, a frequency detector is arranged to drive a charge pump circuit with UP and DOWN signals. The charge pump circuit provides a control signal to a voltage-controlled oscillator such that a VCO clock signal is produced. The UP and DOWN signals stabilize to a common logic level (i.e. a low logic level) when the frequency of the VCO clock signal is locked to the frequency of a reference clock signal. A phase-detector that is separate from the frequency detector may be employed to adjust the phase relationship between the VCO clock signal and the reference clock signal. The frequency detector operates without detecting (or comparing) the phase relationship between the reference clock signal and the VCO clock signal.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION OF THE PREFERRED EMBODIMENT

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on".

Figure 1:
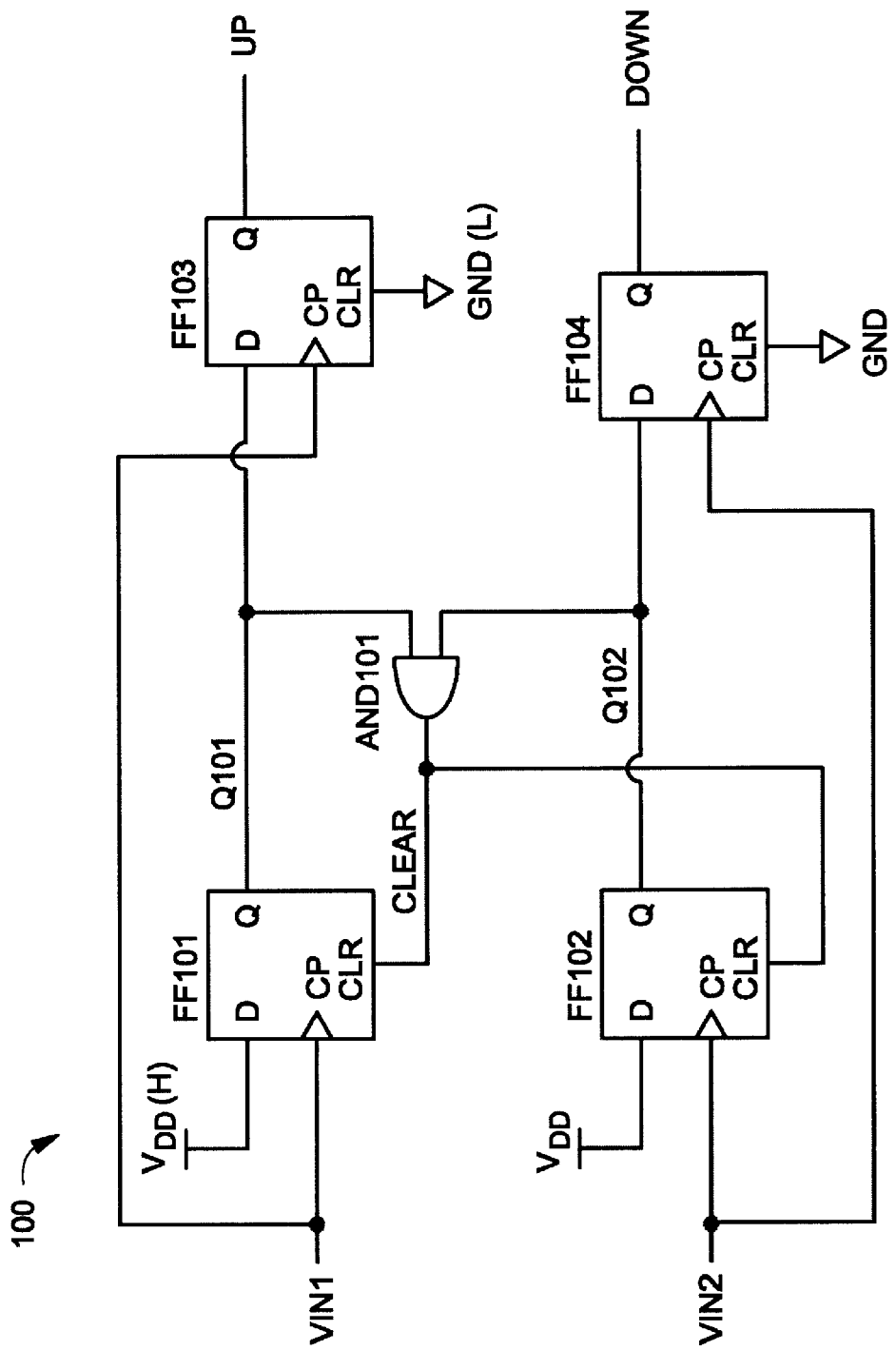
FIG. 1 is a schematic diagram of an exemplary frequency detector circuit.

FIG. 1 is a schematic diagram of an exemplary frequency detector circuit (100) that is arranged in accordance with the present invention. The frequency detector circuit (100) includes four flip-flop circuits (FF101–FF104 ), and an AND logic circuit (AND101). The frequency detector circuit (100) may be implemented, in part or whole, as an integrated circuit.

Flip-flop circuits FF101–FF104 are D-type flip-flops that each include a D-type input terminal (D), a clock input terminal (CP), a clear input terminal (CLR), a Q output terminal (Q). Although flip-flop circuits FF101–FF104 are depicted in FIG. 1 as D-type flip-flops, other types of memory circuits may also be utilized. For example, frequency detector 100 may utilize a JK-type flip-flop, an RS-type flip-flop, and/or a T-type flip-flop. Additional logic may be necessary to configure the other types of flip-flop circuits to perform the same functions as flip-flops FF101–FF104.

The clock input terminals (CP) of flip-flop circuits FF101 and FF103 are coupled together. The clock inputs terminals (CP) of flip-flop circuits FF102 and FF104 are coupled together. The D input terminals of flip-flop circuits FF101–FF102 are coupled to a high logic signal level (H). The clear input terminals (CLR) of flip-flop circuits FF103–FF104 are coupled to a low logic signal level (L). The Q output terminal of flip-flop circuit FF101 is coupled to the D input terminal of flip-flop circuit FF103. The Q output terminal of flip-flop circuit FF102 is coupled to the D input terminal of flip-flop circuit FF104. AND101 has an output terminal that is coupled to the CLR input terminals of flip-flop-circuits FF101–FF102, a first input terminal that is coupled to the Q output terminal of flip-flop circuit FF101, and a second input terminal that is coupled to the Q output terminal of flip-flop circuit FF102.

In operation, frequency detector circuit 100 is arranged to detect a difference in the frequency associated with two clock signals (VIN1, VIN2). Frequency detector circuit 100 receives the first clock signal at the clock input terminals (CP) of flip-flop circuits FF101 and FF103, while the second clock signal is received at the clock input terminals (CP) of flip-flop circuits FF102 and FF104. The Q output terminal of flip-flop circuit FF103 is arranged to provide the UP signal, while the Q output terminal of flip-flop circuit FF104 provides the DOWN signal. And circuit AND101 provides a CLEAR signal to the clear input terminals (CLR) of flip-flop circuits FF101–FF102.

Flip-flop circuits FF101 and FFD103 are configured to operate as a two-stage shift register. Similarly, flip-flop circuits FF102 and FF104 are configured to operate as another two-stage shift register.

The Q output terminal of flip-flop circuit FF101 provides a signal (Q101) that is responsive to the various input signals of flip-flop FF101, while the Q output terminal of flip-flop circuit FF102 provides a signal (Q102) that is responsive to the various input signals of flip-flop FF102. AND logic circuit AND101 provides a CLEAR signal to the CLR input terminals of flip-flop circuits FF101–FF102 in response to signals Q101 and Q102 (i.e., when Q101 and Q102 are both at "logic 1"). The Q101 and Q102 signals are maintained as a low logic signal (i.e., L, "logic 0", etc.) while the CLEAR signal is maintained as a high logic signal (i.e., H, "logic 1", etc.).

The D input terminal of flip-flop circuit FF101 receives a high logic signal (i.e., "H", "logic 1", etc.), while the clock input terminal (CP) of flip-flop circuit FF101 receives the first input signal (VIN1). Each time the first input signal (VIN1) transitions from a low logic signal (i.e., logic "0") to a high logic signal, flip-flop circuit F101 evaluates the D input terminal to determine if the Q output may change. Similarly, the D input terminal of flip-flop circuit FF102 receives a high logic signal (i.e., "H", "logic 1", etc.), while the clock input terminal (CP) of flip-flop circuit FF102 receives the second input signal (VIN2). Each time the second input signal (VIN2) transitions from a low logic signal (i.e., logic "0") to a high logic signal, flip-flop circuit FF102 evaluates the D input terminal to determine if the Q output may change. Signals Q101 and Q102 will only change to a high logic level (i.e., H, "logic 1", etc.) when the CLEAR signal is at a low logic level and signals VIN1 and VIN2 generate a clock edge for flip-flop circuits FF101 and FF102, respectively.

The Q output terminal of flip-flop circuit FF103 provides a signal (UP) that is responsive to the various input signals of flip-flop FF103, while the Q output terminal of flip-flop circuit FF104 provides a signal (DOWN) that is responsive to the various input signals of flip-flop FF104. The D input terminal of flip-flop circuit FF103 receives the Q101 signal, while the clock input terminal (CP) of flip-flop circuit FF103 receives the first input signal (VIN1). Each time the first input signal (VIN1) transitions from a low logic signal (i.e., "logic 0") to a high logic signal (i.e., "logic 1"), flip-flop circuit F103 evaluates the D input terminal to determine if the Q output may change. Similarly, the D input terminal of flip-flop circuit FF104 receives the Q102 signal, while the clock input terminal (CP) of flip-flop circuit FF104 receives the second input signal (VIN2). Each time the second input signal (VIN2) transitions from a low logic signal (i.e., "logic 0") to a high logic signal (i.e., "logic 1"), flip-flop circuit FF104 evaluates the D input terminal to determine if the Q output may change.

AND logic circuit AND101 is configured to facilitate a shift register operation on the pairs of flip-flop circuits FF101, FF103, and FF102, FF104, respectively. For example, a high logic level (i.e., "logic 1") will shift from the D input of flip-flop circuit FF101 to the Q output terminal of flip-flop circuit FF103 when two consecutive high logic pulses of the VIN1 signal are received prior to receiving a VIN2 high logic pulse. The D input terminal of flip-flop circuit FF103 must correspond to a high logic level on the next high logic pulse of the VIN1 signal in order to "shift" the high logic D input of flip-flop circuit FF101 to the Q output terminal of flip-flop circuit FF103. Otherwise the UP signal will remain as a low logic level (i.e., L, "logic 0", etc.) when the CLEAR signal resets the Q101 signal to a low logic level prior to the pulse of the VIN1 signal. Flip-flop circuits FF102 and FF104 operate in a substantially similar manner as flip-flop circuits FF101 and FF103, except that the VIN2 signal provides the clocking pulses to operate as a shift register for the DOWN signal.

Exemplary frequency detector circuit 100 compares the frequency of the VIN1 signal (i.e., f1) to the frequency of the VIN2 signal (i.e., f2). When the frequency of the VIN1 signal is higher than the frequency of the VIN2 signal (i.e., f1>f2), the UP signal corresponds to a high logic level, and the DOWN signal corresponds to a low logic level. Similarly, when the frequency of the VIN2 signal is higher than the frequency of the VIN1 signal (i.e., f2>f1), the UP signal corresponds to a low logic level, and the DOWN signal corresponds to a high logic level. When the frequencies of the VIN1 signal and the VIN2 signal are the same (i.e., f1=f2), the UP and DOWN signals correspond to a low logic level.

The period (T1) of the VIN1 signal is given by T1=1/f1, while the period (T2) of the VIN2 signal is given by T2=1/f2. An integer number of VIN1 pulses (N1) and an integer number of VIN2 pulses (N2) occur over a given time interval (K), such that K=N1*T1=N2*T2. The average number of UP and DOWN signal pulses over the time interval K is related to the frequencies of the VIN1 and VIN2 signals. As stated previously, the UP signal will remain as a low logic level when f1 is less than or equal to f2, and the DOWN signal will remain as a low logic level when f1 is greater than or equal to f2. Thus, (N2−N1) occurrences of VIN1 pulses will result without a CLEAR signal (caused by a VIN2 pulse) resetting flip-flop circuit FF101 when f1>f2, (N1−N2) occurrences of VIN2 pulses will result without a CLEAR signal (caused by a VIN1 pulse) resetting flip-flop circuit FF102 when f2>f1.

Mathematically, the average value of the UP and DOWN signal values may be determined as described below.

The average value of the UP and DOWN signals (AVG_UP, AVG_DOWN) during time interval K when f1>f2, may be determined as:

$$\begin{aligned}
\text{AVG\_DOWN} &= 0 \quad , \text{and} \quad \text{(Eq. I)}\\
\text{AVG\_UP} &= [N1 - N2] * T1/K \\
&= [(K/T1) - (K/T2)] * T1/K \\
&= [(1/T1) - (1/T2)] * T1 \\
&= [f1 - f2]/f1 \\
&= 1 - f2/f1
\end{aligned}$$

Similarly, the average value of the UP and DOWN signals (AVG_UP, AVG_DOWN) during time interval K when f1>f2, may be determined as:

$$\begin{aligned}
\text{AVG\_UP} &= 0 \quad , \text{and} \quad \text{(Eq. II)}\\
\text{AVG\_DOWN} &= [N2 - N1] * T2/K \\
&= [(K/T2) - (K/T1)] * T2/K \\
&= [(1/T2) - (1/T1)] * T2 \\
&= [f2 - f1]/f2 \\
&= 1 - f1/f2
\end{aligned}$$

Lastly, the average value of the UP and DOWN signals during time interval K, when f1=f2, is given by: AVG_UP=AVG_DOWN=0.

As illustrated above, the average value of the UP and DOWN signals is a function of the frequency of the VIN1 and VIN2 signals over a time interval K. Interestingly, the UP and DOWN signal never correspond to a negative number. Instead, the UP and DOWN signals always correspond to a value between a low logic value, (i.e., L, "logic 0", etc.) and a high logic value (i.e., H, "logic 1", etc.).

Figure 2:
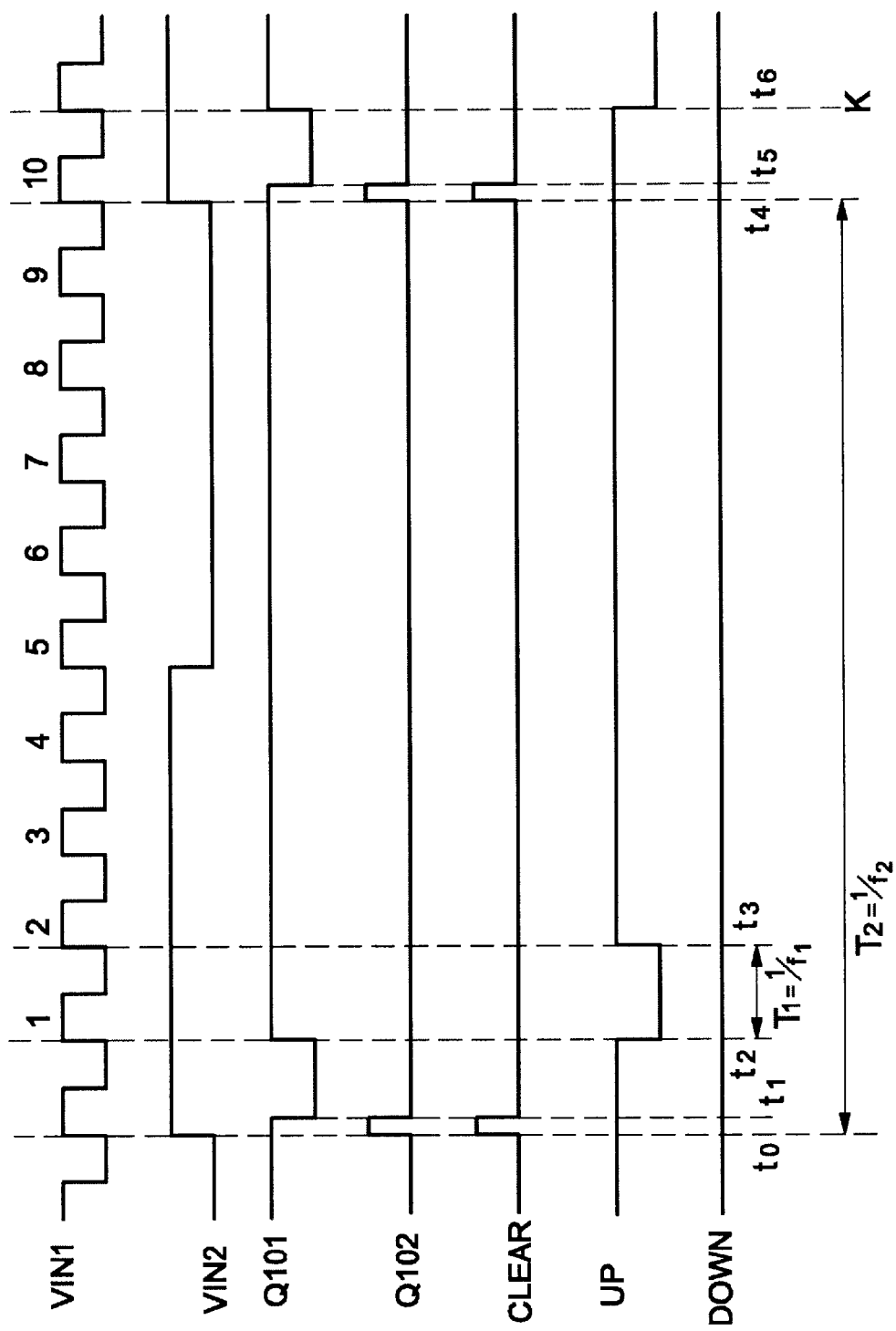
FIG. 2 is a exemplary timing diagram for an exemplary frequency detector circuit.

An exemplary timing diagram is depicted in FIG. 2 to facilitate an understanding of the mathematical relationships described above. In this example, signal VIN1 has a frequency that is ten times the frequency of signal VIN2. As shown in the timing diagram, there are ten cycles of signal VIN1 and one cycle of signal VIN2 during a time interval K.

At time t0, signal Q101 is a high logic signal, and signal Q102 change from a low logic signal to a high logic signal in response to the rising edge of signal VIN2. The CLEAR signal is asserted as a high logic level at approximately time t0 (ignoring the setup time of flip-flop circuit FF102 ), resulting in flip-flop circuits FF102 and FF103 being reset by time t1 to a low logic level. After flip-flop circuits FF101 and FF102 are cleared, the CLEAR signal returns to a low logic level.

At time t2, signal Q101 transitions from a low logic level to a high logic level in response to the rising edge of signal VIN1. Also at time t2, the UP signal transitions from a high logic level to a low logic level in response to signal Q101 (which is a low logic level), and in response to the rising edge of signal VIN1. At time t3, the UP signal transition from a low logic level to a high logic level in response to the rising edge of signal VIN1, and also in response to the high logic level associated with signal Q101.

At time t4, signal VIN2 transitions from a low logic level to a high logic level resulting in signal Q102 transitioning from a low logic level to a high logic level. The CLEAR signal will again be asserted to a high logic level at time t4, resulting in flip-flop circuits FF102 and FF103 being reset by time t5 to a low logic level. After flip-flop circuits FF101 and FF102 are cleared, the CLEAR signal returns to a low logic level at time t5. At time t6, signal UP transitions from a high logic level to a low logic level in response to the rising edge of signal VIN1, and also as a result of the low logic level associated with signal Q101.

As described previously with respect to FIG. 1, two rising edge signals are required to assert either one of the UP and DOWN signals. As illustrated in FIG. 2, the DOWN signal remains at a low logic level, while the UP signal is asserted to a high logic level at time t3. Over the time interval (K), signal VIN1 cycles ten times, while signal VIN2 cycles one time, resulting in an UP signal that has a duty cycle of 90%. The 90% duty cycle corresponds to the difference in frequency between the signals VIN1 and VIN2, which is ten-to-one.

The above-described frequency detector is useful in a frequency locked loop application. The frequency detector compares the frequency between a reference clock signal and another clock signal, without comparing the phase of the signals. The frequency detector provides UP and DOWN signal that indicate the difference in the reference clocks signal and the other clock signal. At steady-state, the UP and DOWN signals stabilize at a fixed logic level (i.e., a low logic level) when the frequency of the reference clock signal and the other clock signal are locked with respect to one another. The frequency locked relationship between the reference clock signal and the other clock signal is independent of any phase relationship between the signals.

Figure 3:
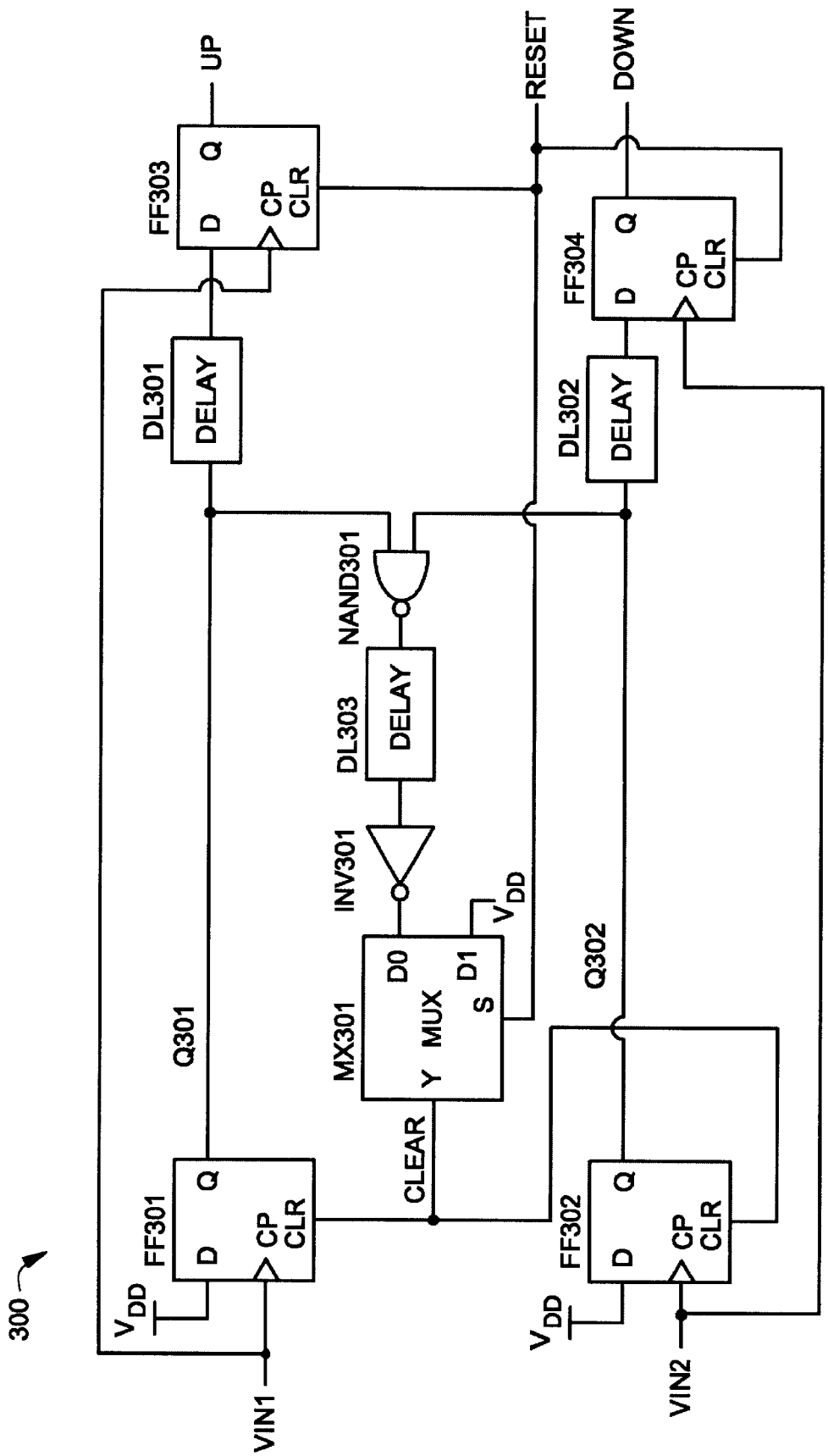
FIG. 3 is a schematic diagram for another exemplary frequency detector circuit.

FIG. 3 is a schematic diagram of another exemplary frequency detector circuit (300) that is arranged in accordance with the present invention. Frequency detector circuit 300 includes four flip-flop circuits (FF301–FF304), a NAND logic circuit (NAND301), an inverter logic circuit (INV301), a mutliplexer circuit (MX301), and three delay circuits (DL301–303). Frequency detector circuit 300 may be implemented, in part or whole, as an integrated circuit.

Flip-flop circuits FF301–FF304 are D-type flip-flops that each include a D-type input terminal (D), a clock input terminal (CP), a clear input terminal (CLR), a Q output terminal (Q). The clock input terminals (CP) of flip-flop circuits FF301 and FF303 are coupled together. The clock inputs terminals (CP) of flip-flop circuits FF302 and FF304 are coupled together. The D input terminals of flip-flop circuits FF301–FF302 are coupled to a high logic signal level (H) such as provided by a high power supply voltage (VDD). The clear input terminals (CLR) of flip-flop circuits FF303–FF304 are coupled together to a RESET signal. The Q output terminal of flip-flop circuit FF301 is coupled to the D input terminal of flip-flop circuit FF303 through delay circuit DL301. The Q output terminal of flip-flop circuit FF302 is coupled to the D input terminal of flip-flop circuit FF304 through delay circuit DL 302. NAND301 has an output terminal that is coupled to an input of delay circuit DL 303, an input terminal that is coupled to the Q output terminal of flip-flop circuit FF301, and another input terminal that is coupled to the Q output terminal of flip-flop circuit FF302. Delay circuit 303 has an output terminal that is coupled to an input terminal of inverter circuit INV301. Inverter circuit INV301 has an output terminal that is coupled to a first input terminal (D0) of multiplexer MX301. Mutliplexer MX301 has another input terminal (D1) that is coupled to a high logic level (H) such as provide by a high power supply voltage (VDD), a select input terminal (S) that is coupled to the RESET signal, and an output terminal (Y) that is coupled to the CLR input terminals of flip-flop circuits FF301–FF302.

Frequency detector circuit 300 is arranged to operate in a substantially similar manner as previously described frequency detector circuit 100. For example, flip-flop circuits FF301 and FF302 are arranged to provide signals Q301 and Q302, respectively, in response to a transition in the signal VIN1 and VIN2, respectively. Thus, flip-flop circuits FF301 and FF302 operate as means for detecting a transition in their respective input signals. Delay circuits DL301 and DL302 are arranged to operate as means for delaying changes in signals Q301 and Q302, respectively, such that the setup times for flip-flop circuits FF303 and FF304 are adequately satisfied for predictable performance. Multiplexer MX301, NAND logic circuit NAND301, delay circuit DL303, and inverter circuit INV301 are arranged to operate in a substantially similar manner as AND logic circuit AND101, described previously with respect to FIG. 1. Similar to that discussed with respect to FIG. 1, flip-flop circuits FF302 and FF304 operate as means for detecting a transition in their respective clock input signals. Two transitions in the input signals (VIN1 or VIN2) must occur, without a CLEAR signal, before the UP or DOWN signals may be set to a high logic level by flip flop circuits FF303 and FF304, respectively.

Multiplexer MX301, NAND logic circuit NAND301, delay circuit DL303, and inverter circuit INV301 are arranged to operate as a clear logic circuit, which provides a means for resetting flip-flop circuits FF301 and FF302. Delay circuit DL303 is arranged to provide a delay (a means for delaying) to ensure the CLEAR signal has a pulse width that is sufficient to reset flip-flop circuits FF301 and FF302. The RESET signal is arranged to operate as a means to initializing the flip-flop circuits (FF301–FF304) to a known condition, such as for a power-on-reset (POR) condition. Multiplexer MX301 is arranged to force the CLEAR signal to a high logic level when the RESET signal is active (i.e., a high logic level), and to select the combinational logic (INV301, DL303, NAND301) when the reset signal is inactive.

Figure 4:
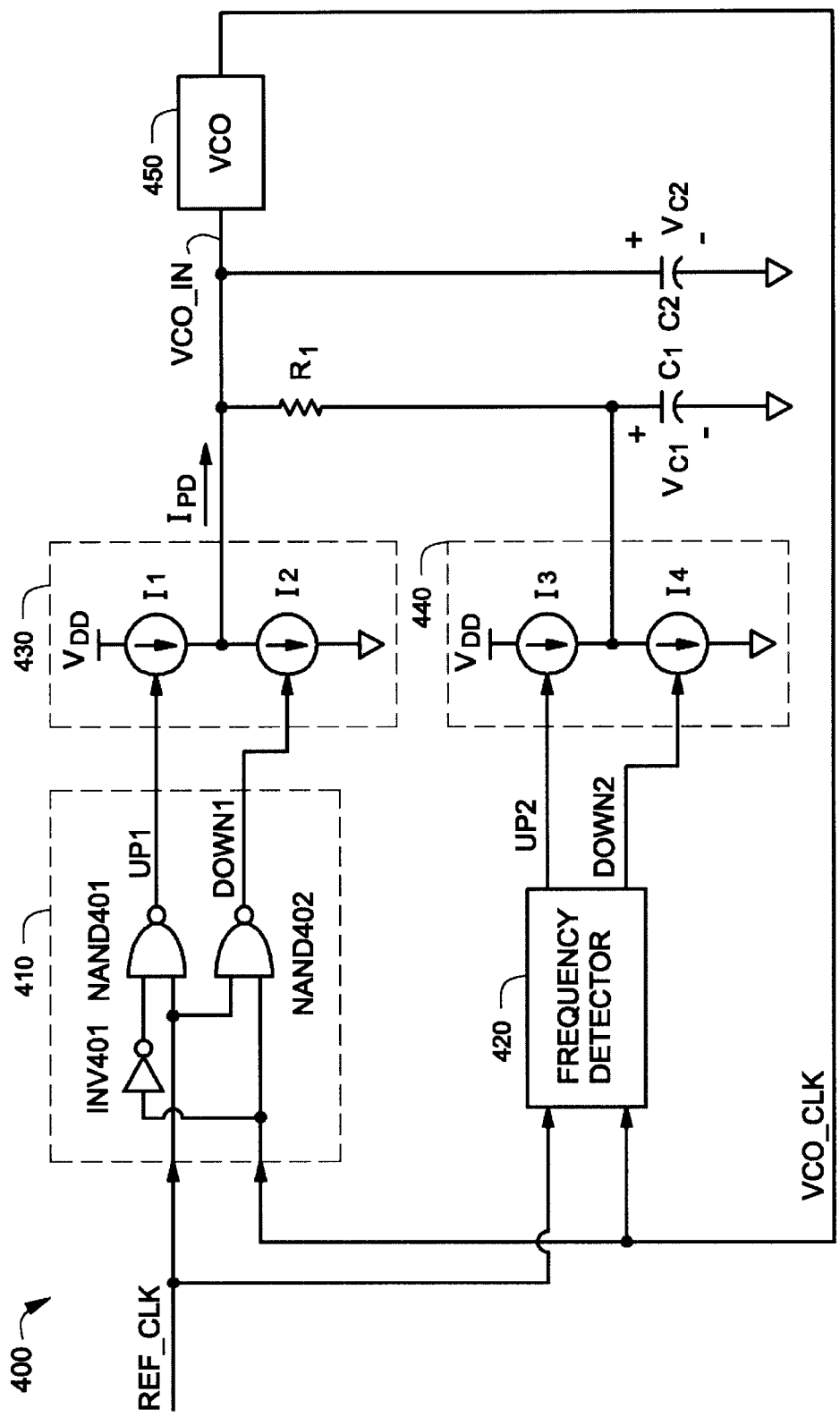
FIG. 4 is a schematic diagram of an exemplary PLL system that employs a frequency detector circuit, in accordance with the present invention

FIG. 4 is a schematic diagram of an exemplary PLL system (400) that employs a frequency detector circuit that is in accordance with the present invention. PLL system 400 includes a phase detector circuit (PD, 410), a frequency detector circuit (FD, 420), two charge pump circuits (CP1, 430; CP2, 440), a VCO circuit (450), a resistor (R1), and two capacitors (C1, C2). PLL system 400 may be implemented, in part or whole, as an integrated circuit.

Phase detector circuit 410 is arranged to produce a first up and down signal (UP1, DOWN1) in response to comparing the phases between a reference clock signal (REF_CLK) and a VCO output clock signal (VCO_CLK). Charge pump circuit 430 includes a first current source (I1), and a second current source (I2). Current source I1 is selectively activated in response to signal UP1, while current source I2 is selectively activated in response to signal DOWN1. Current sources I1 and I2 are arranged to provide a first current IPD in response to the UP1 and DOWN1 signals, where current IPD may have a positive or negative polarity.

Frequency detector circuit 420 is arranged to produce a second up and down signal (UP2, DOWN2) in response to comparing the frequency between the reference clock signal (REF_CLK) and the VCO output clock signal (VCO_CLK). Charge pump circuit 440 includes a first current source (I3), and a second current source (I4). Current source I3 is selectively activated in response to signal UP2, while current source I4 is selectively activated in response to signal DOWN2. Current sources I3 and I4 are arranged to provide a second current IFD in response to the UP2 and DOWN2 signals, where current IFD may have a positive or negative polarity.

Resistor R1 is coupled between an output of the first charge pump circuit (430) and an output of the second charge pump circuit (440). Capacitor C1 is coupled between the output of the second charge pump circuit (440) and a ground terminal. Capacitor C2 is coupled between the output of the first charge pump circuit and the ground terminal. Capacitor C1 is arranged to operate as a charge integration capacitor (i.e., a means for integrating) in response to currents IFD and IPD. For example, assuming that resistor R1 isolates capacitors C1 and C2, capacitor C1 will charge up at a rate given by IFD/C1 volts-per-second, when IPD is nominally zero. Capacitor C2 is arranged to operate as a filter capacitor to minimize glitching in a signal VCO_IN. In one example, capacitor C1 has a value that is 0.5 uF, while capacitor C2 has a value that is 0.01 uF.

Frequency detector circuit 420 corresponds to a frequency detector circuit as previously described with respect to FIGS. 1–3. VCO 450 is arranged to provide the VCO output clock signal (VCO_CLK) in response to a VCO control signal (VCO_IN). The VCO control signal (VCO_IN) corresponds to the voltage across capacitor C2 (i.e., VC2). VCO_IN is related to the output currents from the charge pump circuits (IPD, IFD) and the values associated with resistor R1, capacitor C1, and capacitor C2.

In one example, the frequency of VCO_CLK is initially much lower than the frequency of REF_CLK and frequency detector circuit 420 will assert the UP2 signal, while the DOWN2 signal is set to zero (see Eq. I, where f1 is related to REF_CLK, and f2 is related to VCO_CLK). Current IFD will have a positive polarity while UP2 is asserted such that capacitor C1 and C2 will begin to charge. As signal VCO_IN increases the VCO will increase the frequency of signal VCO_CLK. Signals UP2 and DOWN2 will be zero when the frequency of signals VCO_CLK and REF_CLK are matched.

In another example, the frequency of VCO_CLK is initially much higher than the frequency of REF_CLK and frequency detector circuit 420 will assert the DOWN2 signal, while the UP2 signal is set to zero (see Eq. II, where f1 is related to REF_CLK, and f2 is related to VCO_CLK). Current IFD will have a negative polarity while DOWN2 is asserted such that capacitor C1 and C2 will begin to discharge. As signal VCO_IN decreases the VCO will decrease the frequency of signal VCO_CLK. Signals UP2 and DOWN2 will be zero when the frequency of signals VCO_CLK and REF_CLK are matched.

Once the frequency of the VCO_CLK and REF_CLK signals are substantially the same, the frequency of the PLL is "acquired". Phase detector circuit 410 operates as a means for adjusting the phase between the VCO_CLK and REF_CLK signals.

An exemplary phase detector circuit (410) includes an inverter logic circuit (INV401), and two NAND logic circuits (NAND401, NANDA402), as illustrated in FIG. 4. The phase detector circuit asserts the UP1 signal when REF_CLK is a low logic level, or when VCO_CLK is a high logic level. The phase detector circuit asserts the DOWN1 signal when REF_CLK is a low logic level, or when VCO_CLK is a low logic level. Over a given time interval, the average value of the UP1 and DOWN1 signals will correspond to the phase difference between the VCO_CLK signal and the REF_CLK signal. The UP1 signal will remain as a high logic signal when the clock signals are exactly in phase (0 degree phase difference). The DOWN1 signal will remain as a high logic signal when the clock signals are exactly out of phase (180 degrees phase difference, or logical inverses of one another). The average value of UP1 and DOWN1 will have a 50% duty cycle when the phase difference between the REF_CLK signal and the VCO_CLK signal corresponds to 90 degrees. The effect of current IPD on the charging and discharging of capacitors C1 and C2 is similar to that described above with reference to current IFD.

As described-above, the frequency detector is arranged to drive a charge pump circuit with UP and DOWN signals. The charge pump circuit provides a control signal to a voltage-controlled oscillator such that a VCO clock signal is produced. The UP and DOWN signals stabilize to a common logic level (i.e. a low logic level) when the frequency of the VCO clock signal is locked to the frequency of a reference clock signal. A phase-detector that is separate from the frequency detector may be employed to adjust the phase relationship between the VCO clock signal and the reference clock signal. The frequency detector operates without detecting (or comparing) the phase relationship between the reference clock signal and the VCO clock signal.

A constant phase shift between the VCO_CLK signal and the REF_CLK signal is achieved by proper design of the phase detector circuit. For example, the phase detector circuit illustrated in FIG. 4 is arranged to provide a 90-degree phase shift between the VCO CLK signal and the REF_CLK signal. A 90-degree phase shift is useful for data recovery systems (i.e., to align data signals to a sampling clock), as well as other applications such as adjusting a monitor deflection signal, and the like.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus for detecting a difference in frequencies between a first input signal and a second input signal, comprising:
    a clear logic circuit that is arranged to activate a clear signal when a first intermediate signal and a second intermediate signal correspond to a first logic level, and arranged to deactivate the clear signal when at least one of the first intermediate signal and the second intermediate signal corresponds to a second logic level, wherein the second logic level is an inverse of the first logic level, wherein the clear logic circuit comprises:
        a delay circuit that includes an input terminal and an output terminal;
        a NAND logic circuit that has an input terminal that is coupled to the first intermediate signal, another input terminal that is coupled to the second intermediate signal, and an output terminal that is coupled to the input terminal of the delay circuit; and
        an inverter circuit that includes an input terminal that is coupled to the output terminal of the delay circuit, and an output terminal that is configured to provide the clear signal;
    a first flip-flop circuit that is arranged to set the first intermediate signal to the first logic level in response to the first input signal when the clear signal is deactivated, and arranged to reset the first intermediate signal to the second logic level when the clear signal is activated;
    a second flip-flop circuit that is arranged to set the second intermediate signal to the first logic level in response to the second input signal when the clear signal is deactivated, and arranged to reset the second intermediate signal to the second logic level when the clear signal is activated;
    a third flip-flop circuit that is arranged to activate an up signal in response to the first input signal when the first intermediate signal corresponds to the first logic level, such that the up signal is activated when the first input signal pulses twice before the clear signal is activated; and
    a fourth flip-flop circuit that is arranged to activate a down signal in response to the second input signal when the second intermediate signal corresponds to the first logic level, such that the down signal is activated when the second input signal pulses twice before the clear signal is activated, wherein the up and down signals are related to the difference in frequencies between the first input signal and the second-input signal.

2. An apparatus as in claim 1, wherein the first flip-flop circuit, the second flip-flop circuit, the third flip-flop circuit, and the fourth flip-flop circuit correspond to D-type flip-flop circuits.

3. An apparatus as in claim 1, wherein the clear logic circuit further comprises an AND logic circuit.

4. An apparatus as in claim 1, the clear logic circuit further comprising a delay circuit that includes an input terminal and an output terminal, wherein the delay circuit has a transport delay that is associated with a change in a logic signal at the input terminal and a change in another logic signal at the output terminal such that the clear signal is activated for a minimum pulse-width that is related to the transport delay.

5. An apparatus as in claim 1, the clear logic circuit further comprising a multiplexer circuit that includes an input terminal that is coupled to the output terminal of the inverter circuit, another input terminal that is coupled to a power supply signal, a select terminal that is coupled to a reset signal, and an output terminal that is configured to provide the clear signal by selecting between the power supply signal and the output terminal of the inverter circuit in response to the reset signal.

6. An apparatus for detecting a difference in frequencies between a first input signal and a second input signal, comprising:
    a clear logic circuit that is arranged to activate a clear signal when a first intermediate signal and a second intermediate signal correspond to a first logic level, and arranged to deactivate the clear signal when at least one of the first intermediate signal and the second intermediate signal corresponds to a second logic level, wherein the second logic level is an inverse of the first logic level;
    a first flip-flop circuit that is arranged to set the first intermediate signal to the first logic level in response to the first input signal when the clear signal is deactivated, and arranged to reset the first intermediate signal to the second logic level when the clear signal is activated;
    a second flip-flop circuit that is arranged to set the second intermediate signal to the first logic level in response to the second input signal when the clear signal is deactivated, and arranged to reset the second intermediate signal to the second logic level when the clear signal is activated;

a third flip-flop circuit that is arranged to activate an up signal in response to the first input signal when the first intermediate signal corresponds to the first logic level, such that the up signal is activated when the first input signal pulses twice before the clear signal is activated;

a fourth flip-flop circuit that is arranged to activate a down signal in response to the second input signal when the second intermediate signal corresponds to the first logic level, such that the down signal is activated when the second input signal pulses twice before the clear signal is activated, wherein the up and down signals are related to the difference in frequencies between the first input signal and the second input signal; and a first delay circuit that is arranged to provide the first intermediate signal to the third flip-flop circuit after a predetermined delay, and a second delay circuit that is arranged to provide the second intermediate signal to the fourth flip-flop circuit after another predetermined delay, such that the third and fourth flip-flop circuits have stable input signals when the first and second input signals transition.

7. An apparatus as in claim 1, wherein the first, second, third, and fourth flip-flop circuits are arranged-such that the up and down signals correspond to low logic levels when the frequencies of the first and second input signals are matched.

8. An apparatus as in claim 1, wherein the first, second, third, and fourth flip-flop circuits are arranged such that the down signal corresponds to a low logic level, and the up signal has an average logic level (AVG_UP) that is given by:

$$AVG\_UP=1-(f2/f1),$$

where f1 corresponds to the frequency of the first input signal, f2 corresponds to the frequency of the second input signal, and f1>f2.

9. An apparatus as in claim 1, wherein the first, second, third, and fourth flip-flop circuits are arranged such that the up signal corresponds to a low logic level, and the down signal has an average logic level (AVG_DOWN) that is given by:

$$AVG\_DOWN=1-(f1/f2),$$

where f1 corresponds to the frequency of the first input signal, f2 corresponds to the frequency of the second input signal, and f1<f2.

10. An apparatus for detecting a difference between a frequency that is associated with a clock signal and a frequency that is associated with a reference clock signal, comprising:

a first means for detecting a transition in the reference clock signal and providing a first intermediate signal that has a first logic level;

a second means for detecting a transition in the clock signal and providing a second intermediate signal that has a first logic level;

a means for resetting arranged to provide a clear signal when the first and second intermediate signals correspond to the first logic level, such that the clear signal sets the first and second intermediate signals to a second logic level when the clear signal is asserted, wherein the second logic level is an inverse of the first logic level;

a first means for delaying that is arranged to provide a first delayed signal in response to the first intermediate signal, wherein the first delayed signal is related to the first intermediate signal according to a delay factor;

a third means for receiving the first delayed signal and detecting a transition in the reference clock signal to provide an up signal when the reference clock pulses at least twice without asserting the clear signal;

a fourth means for receiving the second intermediate signal and detecting a transition in the clock signal to provide a down signal when the reference clock pulses at least twice without asserting the clear signal.

11. An apparatus for detecting a difference between a frequency that is associated with a clock signal and a frequency that is associated with a reference clock signal, comprising:

a first means for detecting a transition in the reference clock signal and providing a first intermediate signal that has a first logic level;

a second means for detecting a transition in the clock signal and providing a second intermediate signal that has a first logic level;

a means for resetting arranged to provide a clear signal when the first and second intermediate signals correspond to the first logic level, such that the clear signal sets the first and second intermediate signals to a second logic level when the clear signal is asserted, wherein the second logic level is an inverse of the first logic level;

a second means for delaying that is arranged to provide a second delayed signal in response to the second intermediate signal, wherein the second delayed signal is related to the second intermediate signal according to a delay factor;

a third means for receiving the first intermediate signal and detecting a transition in the reference clock signal to provide an up signal when the reference clock pulses at least twice without asserting the clear signal; and a fourth means for receiving the second delayed signal and detecting a transition in the clock signal to provide a down signal when the reference clock pulses at least twice without asserting the clear signal.

12. A phase-locked-loop system, comprising:

a voltage controlled oscillator that is arranged to provide a VCO clock signal, wherein the VCO clock signal has a corresponding frequency of f2 that is adjusted in response to a VCO input signal;

a phase detector circuit that provides a first up signal and a first down signal in response to a reference clock signal and the VCO clock signal, wherein the reference clock signal has a corresponding frequency of f1, wherein the phase detector circuit comprises:

a first NAND logic circuit that is arranged to provide the first up signal in response to the reference clock signal and an inverse of the VCO clock signal;

a second NAND logic circuit that is arranged to provide the first down signal in response to the reference clock signal an the VCO clock signal; and an inverter circuit that is arranged to provide the inverse of the VCO clock signal in response to the VCO clock signal;

a first charge-pump circuit that is arranged to provide a first current in response to the first up signal and the first down signal;

a frequency detector circuit that provides a second up signal and a second down signal in response to the reference clock signal and the VCO clock signal, wherein an average logic level of the second up signal corresponds to zero when $f2 \geq f1$, the average logic level of the second up signal corresponds to $(1-(f2/f1))$ when $f1>f2$, an average logic level of the second down signal corresponds to zero when $f1 \geq f2$, and an average logic level of the second down signal corresponds to $(1-(f1/f2))$ when $f2>f1$;

a second charge-pump circuit that is arranged to provide a second current in response to the second up signal and the second down signal such that the second current has an average value that is related to the average logic levels of the second up signal and the second down signal; and a capacitor circuit that is arranged to provide the VCO input signal in response to the first current and the second current, wherein the frequency detector circuit is arranged to acquire a frequency lock between the reference clock signal and the VCO clock signal, and the phase detector circuit is arranged to adjust the phase between the reference clock signal and the VCO clock signal.

13. A phase-locked-loop system as in claim 12, the frequency detector circuit comprising:

a clear logic circuit that is arranged to activate a clear signal when a first intermediate signal and a second intermediate signal correspond to a first logic level, and arranged to deactivate the clear signal when at least one of the first intermediate signal and the second intermediate signal corresponds to a second logic level, wherein the second logic level is an inverse of the first logic level;

a first flip-flop circuit that is arranged to set the first intermediate signal to the first logic level in response to the reference clock signal when the clear signal is deactivated, and arranged to reset the first intermediate signal to the second logic level when the clear signal is activated;

a second flip-flop circuit that is arranged to set the second intermediate signal to the first logic level in response to the VCO clock signal when the clear signal is deactivated, and arranged to reset the second intermediate signal to the second logic level when the clear signal is activated;

a third flip-flop circuit that is arranged to activate an up signal in response to the reference clock signal when the first intermediate signal corresponds to the first logic level, such that the up signal is activated when the reference clock signal pulses twice before the clear signal is activated; and a fourth flip-flop circuit that is arranged to activate a down signal in response to the VCO clock signal when the second intermediate signal corresponds to the first logic level, such that the down signal is activated when the VCO clock signal pulses twice before the clear signal is activated, wherein the up and down signals are related to the difference in frequencies-between the reference clock signal and the VCO clock signal.

14. A phase-locked-loop system as in claim 12, wherein the phase detector circuit is arranged to adjust a phase between the reference clock signal and the VCO clock signal such that there is a constant phase difference between the reference clock signal and the VCO clock signal.

* * * * *

UNITED STATES PATENT AND TRADEMARK OFFICE
CERTIFICATE OF CORRECTION

PATENT NO.    : 6,642,747 B1
DATED         : November 4, 2003
INVENTOR(S)   : Chiu It is certified that error appears in the above-identified patent and that said Letters Patent is hereby corrected as shown below:

Column 11,
Line 26, "are arranged-such that" should read -- are arranged such that --

Column 12,
Line 8, "asserting the clear signal;" should read -- asserting a clear signal; and --
Line 59, "clock signal an the VCO" should read -- clock signal and the VCO --

Column 14,
Line 25, "difference in frequencies-between" should read -- difference in the frequencies between --

Signed and Sealed this

Twenty-third Day of March, 2004

JON W. DUDAS
*Acting Director of the United States Patent and Trademark Office*